United States Patent [19]

Ahne et al.

[11] Patent Number: 4,732,951

[45] Date of Patent: Mar. 22, 1988

[54] POLYETHER-BASED PHOTOPOLYMERS

[75] Inventors: Hellmut Ahne, Röttenbach; Winfried Plundrich, Kalchreuth, both of Fed. Rep. of Germany

[73] Assignee: Siemens Aktiengesellschaft, Berlin & Munich, Fed. Rep. of Germany

[21] Appl. No.: 878,020

[22] Filed: Jun. 24, 1986

[30] Foreign Application Priority Data

Jun. 24, 1985 [DE]  Fed. Rep. of Germany ....... 3522537

[51] Int. Cl.$^4$ ............................................. C08G 18/62
[52] U.S. Cl. .................................. 525/528; 427/54.1; 427/58; 427/117; 427/385.5; 427/388.1; 427/388.2
[58] Field of Search ............... 525/528, 534; 427/54.1, 427/58, 117, 385.5, 388.1, 388.2

[56] References Cited

U.S. PATENT DOCUMENTS 4,228,232  10/1980  Rousseau ............................. 528/45
4,233,425  11/1980  Tefertiller et al. .................. 525/528

Primary Examiner—Maurice J. Welsh
Attorney, Agent, or Firm—Kenyon & Kenyon

[57] ABSTRACT

A polyether-based photopolymer, which can be produced inexpensively and without costly purification operations comprises an addition product of an olefin-unsaturated monoisocyanate and a polyether having at least one hydroxyl group. The photopolymer is suitable for use in circuit and transmission line applications as a protective and insulating layer.

16 Claims, No Drawings

POLYETHER-BASED PHOTOPOLYMERS

FIELD OF INVENTION

This invention relates to polyether-based photopolymers, a method for producing such polyether-based polymers, and products prepared therefrom.

BACKGROUND OF THE INVENTION

Polyether-based photopolymers, which are 3-(2-furyl)acrylic acid esters of phenoxy resins having a molecular weight of at least about 15,000, are known in the art (DE-OS No. 25 03 526). These photopolymers, which are used in the graphic arts, in particular for lithographic printing plates and etching resists, are produced by esterification of phenoxy resins with furyl acrylic acid derivatives. The acid chloride, i.e., furyl acryloyl chloride, is preferably used as the starting material. Because for various applications photopolymers must not contain chloride ions, which lead to premature corrosion, costly purification operations are necessary to remove the chloride ions from the esterification products. This, in turn, increases the cost of products made therefrom.

Photopolymers, i.e., photoreactive or photocrosslinkable polymers, are needed, for example, in micro-conductor technology as solder resist and insulating lacquer. Such photopolymers, however, must have a specific spectrum of properties, that is, they must be heat-resistant and capable of being processed to solder bath-resistant, fissureless films. With a single coating, they must effectively protect circuits against moisture and corrosion. Moreover, such photopolymers must be easy to prepare, manufacturered inexpensively, and capable of being processed cost-efficiently with short exposure, developing and hardening times.

Until now, epoxy resins having photo-reactive chalcone groups have been used as photopolymer-based solder resist lacquers. These solder resist lacquers are disadvantageous in that lacquer layers produced therefrom only protect against corrosion effectively if costly multiple coatings are carried out. Furthermore, because of the short-chain polymer base, several hours of thermal rehardening are required. Moreover, the production process for such solder resist lacquers is complex and hence expensive.

Therefore, it is an object of the invention to provide polyether-based photopolymers which can be produced effectively, without costly purification operations, and which are suitable for use in circuit and transmission line applications as protective and insulating layers.

SUMMARY OF THE INVENTION

This and other objects are achieved by the polyether-based photopolymer of the invention which comprises an addition product of an olefin-unsaturated monoisocyanate and a polyether having at least one hydroxyl group.

The invention also provides a method for preparing a polyether-based photopolymer which comprises reacting an olefin-unsaturated monoisocyanate with a polyether having at least one hydroxyl group in an organic solvent, in the presence of a catalyst and/or at an elevated temperature. Additionally, the present invention provides a plastic coating for use on elongated materials, such as on transmission lines, or on substrate surfaces, as well as a damping substance for surface wave filters, such as television intermediate frequency filters, which comprise the polyether-based photopolymer of the invention.

DETAILED DESCRIPTION OF THE INVENION

In the photopolymers of the invention, the photoreactive groups, i.e., the groups containing the olefin-unsaturated structure, are bound to the base polymer via urethane bonds which are formed during the addition of the monoisocyanates to the hydroxyl groups of the polyhydroxy ethers. Photo-reactive polyethers having such structures and which show a surprising spectrum of properties, have been unknown until now.

The photo-reactive polyethers of the invention are very simple to prepare, and can be produced gel-free. They exhibit high solubility in many solvents or solvent mixtures having a wide range of boiling point. Solutions made therefrom, which broadly range in viscosity from about 10 to 5000 mPa.s, remain gel-free at room temperature for months and hence are storage-stable for a surprisingly long time. With these solutions, transparent bright films having smooth homogeneous surfaces can be produced with a single coating process, in a wide range of layer thickness, e.g., 0.01 to 500 um. The layers are of high purity and are moisture resistant. Moreover, they exhibit good electrical characteristics which, surprisingly, do not change, or do so only insignificantly, even in a humid climate.

The photo-reactive polyethers of the invention thus meet the requirements of a durable and protective photo resist for use in micro-conductor technology. Additionally, the manufacturing process can be shortened; due to the sufficiently long chain length of the polymers, thermal rehardening, as is necessary in photo-reactive epoxy resins, is not necessary. The surface quality of the layers produced from the photopolymers of the invention is not impaired under solder bath conditions, and solder adhesion is so low that undesirable sticking of solder beads to the layer surface is avoided.

The photopolymers according to the invention can be crosslinked by radiation and thereby transformed into polymers of high dimensional stability under heat (see the co-pending U.S. patent application "Method for the Production of Heat-resistant Structured Layers", U.S. application Ser. No. 877,872)

The photo-reactive polyethers according to the invention generally have the following structure:

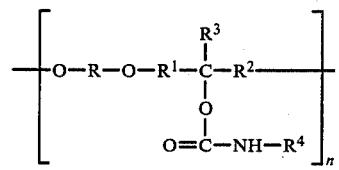

where $n \geq 50$.

For R, $R^1$, $R^2$, $R^3$ and $R^4$ the following applies:

R is an optionally halogenated, divalent, i.e., difunctional, radical of an aromatic and/or aliphatic and/or cycloaliphatic structure, optionally having hetero atoms, and/or a heterocyclic structure;

$R^1$ is a divalent aliphatic radical;

$R^2$ is an optionally halogenated, divalent aliphatic and/or cycloaliphatic radical;

$R^3$ is hydrogen or an optionally halogenated alkyl group;

R[4] is an olefin-unsaturated group bound through an aliphatic and/or cycloaliphatic and/or aromatic bond, for example, a group containing allyl ether or maleinimide, and preferably an optionally substituted (meth)acrylester-containing group. The radicals R, R[1], R[2], R[3] and R[4] have the following meanings in particular:

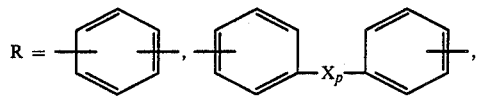

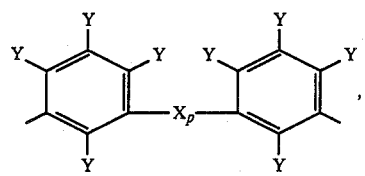

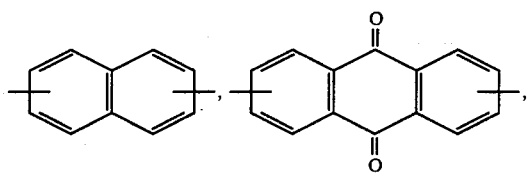

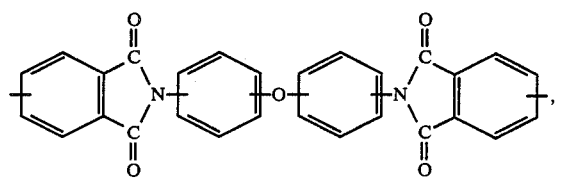

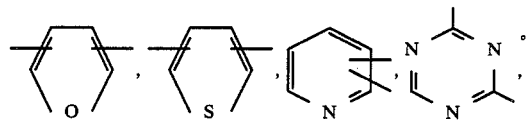

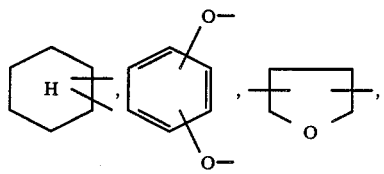

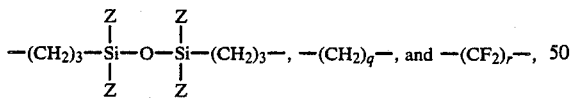

where p=0 or 1, q=2 to 14, r=2 to 18, and for X, Y, and Z there applies:

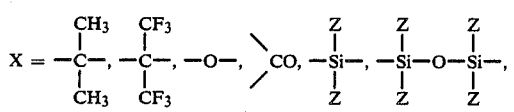

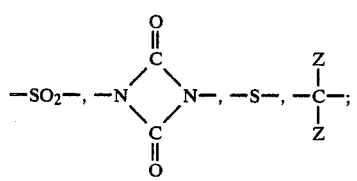

-continued

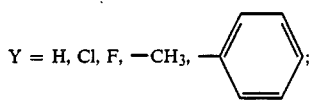

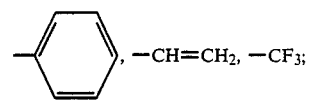

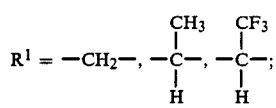

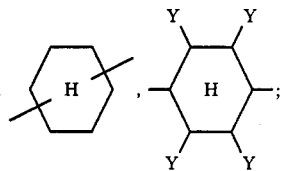

R[3] = H, —CH₃, —CF₃;

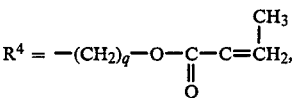

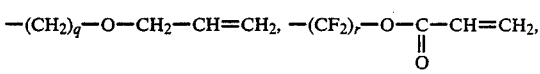

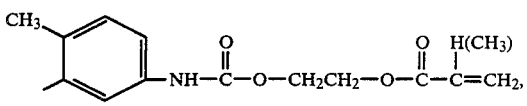

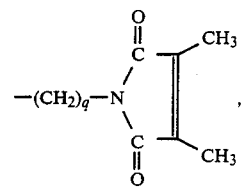

where q and Y are defined as above.

The photopolymers of the invention are addition products of monoisocyanates and polyhydroxy ethers. The polyethers used in the invention are primarily optionally halogenated, aromatic and/or aliphatic and/or cycloaliphatic polyethers, optionally having heteroatoms, and/or heterocyclic polyethers. The polyethers are preferably phenoxy resins, which advantageously have a molecular weight of between 15,000 and 30,000. Such phenoxy resins are commercially available, for example, as Rütapox 0723 and Rütapox 0717 ("Rütapox" is a trademark of Rütgerswerke AG).

Isocyanates containing methacrylate groups, such as isocyanatoethyl methacrylate, and the addition products of hydroxyethyl acrylate or-methacrylate and 2,4-diisocyanatotoluene, as well as mixtures of these compounds, are preferably used as monoisocyanates.

Exemplary structures of the polyether-based photoreactive polymers of the invention are given below:

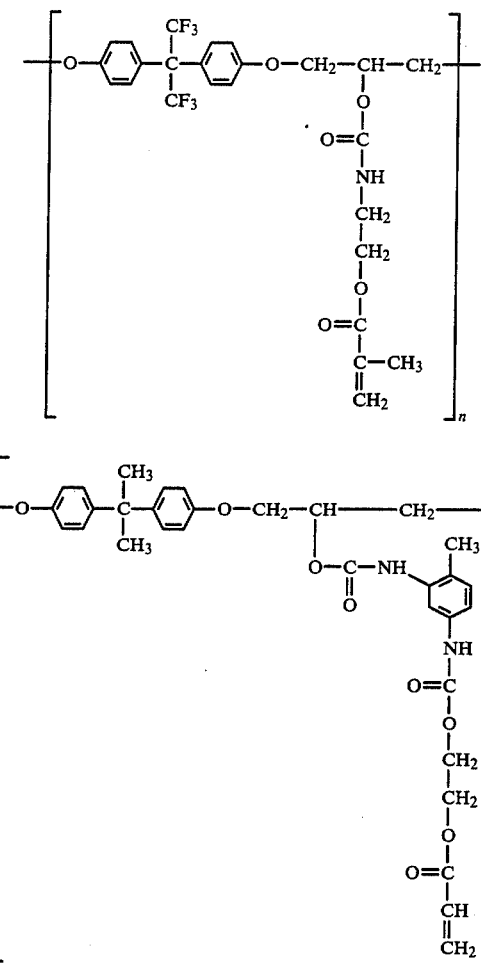

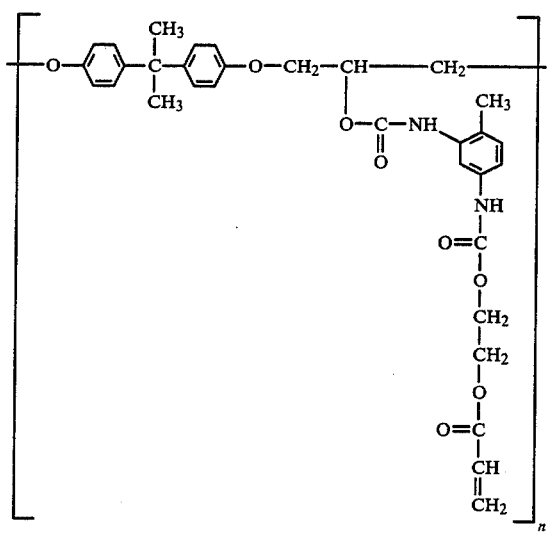

The photopolymers of the invention are produced by causing an olefin-unsaturated monoisocyanate in an organic solvent to react with a polyether having hydroxyl groups, in the presence of a catalyst and/or at elevated temperature. If a catalyst is used, the reaction is generally conducted at room temperature. Dibutyl tin dilaurate or 1,4-diazabicyclo [2.2.2] octane are preferably employed as catalysts.

The products formed in the addition reaction between monoisocyanate and polyhydroxy ether can be isolated in pure form. For further processing, however, it is especially advantageous and cost-effective to use the reaction solution directly, as for the coating of substrates. Of additional advantage is the fact that the solutions of the photopolymers are storage-stable. Also, it is not necessary to isolate the photopolymers before further processing, because their synthesis proceeds chloride-free.

Besides being used as photoresist, and for the production of protective and insulating layers, with photostructuring taking place, the photopolymers of the invention can also be used generally in an unstructured form, for the production of UV-hardenable protective and insulating coatings for elongated materials, such as transmission lines, and for substrate surfaces. These photopolymers can also be used for structuring thermally sensitive substrate surfaces by screen printing. For example, the photopolymers can be used in the productions of damping substances for surface wave filters such as television intermediate frequency filters. Instead of a thermal treatment, UV hardening may be used.

The invention will now be explained more specifically with reference to the following examples, which are illustrative, and not in limitation of the present invention.

EXAMPLE 1

To produce an olefin-unsaturated, photo-reactive monoisocyanate, 40 parts pure 2,4-diisocyanatotoluene are added to 69.2 parts (by weight) dried dichloromethane, in the absence of moisture. 29.2 parts 2-hydroxyethyl acrylate, are then slowly added to the resulting solution in drops, with agitation. The reaction is conducted at room temperature. After the reaction is completed, the solution is left standing for 24 hours at room temperature. The conversion of the isocyanate groups is determined to be 99% by titration. The reaction solution can be employed directly for further processing. But it is also possible to isolate the photoreactive monoisocyanate by extraction with light petrol, in the form of a clear viscous liquid as pure substance; the characterization is done by NCO titration.

140 parts dry gamma-butyrolactone, 135 parts dry N-methyl pyrrolidone and 50 parts of the photo-reactive monoisocyanate produced in the above described manner, as well as 0.1 parts dibutyl tin dilaurate, are added to 35 parts of the phenoxy resin Rutapox 0717 at room temperature, and under agitation. The resulting solution is stirred for 48 hours at room temperature and then mixed with 7 parts ethanol, to block residual isocyanate groups. After a reaction time of 24 hours, no more isocyanate groups are detectable and the reaction solution is ready for use; the viscosity of the solution is 830 mPa.s at 23° C.

EXAMPLE 2

33 parts pure isocyanatoethyl methacrylate and 0.1 part dibutyl tin dilaurate are added to a solution of 110 parts Rutapox 0723 (50% solution in cyclohexanone/ethyl glycol acetate) in 114 parts gamma-butyrolactone. Thereafter, the mixture is stirred for 50 hours at room temperature. Then, 9 parts 2-hydroxyethyl methacrylate are added to the reaction solution, to transform residual isocyanate groups. The solution is then left standing for 24 hours at room temperature. Thereafter, 3.5 parts dichloroacetophenone and 0.9 parts Michler's ketone are added, after which the solution is ready for use. By centrifuging onto aluminum substrates and drying for two hours at 70° C., 100 um thick homogeneous layers are obtained, which under irradiation with a 350 W superpressure mercury lamp are photo-chemically crosslinked within 20 s, thereby becoming insoluble in solvents such as gamma-butyrolactone/xylene.

EXAMPLE 3

62 parts 2,4-diisocyanatotoluene are added in drops, in the absence of moisture, to 113.2 parts dried dichloromethane. Then, 51.2 parts 2-hydroxyethyl methacrylate are slowly added in drops to the mixture at room temperature and under agitation. After reaction at room temperature for 24 hours, the isocyanate conversion is determined titrimetrically to be 99%. Upon the addition of 450 parts light petrol, a precipitate of white crystals is obtained. The yield of pure photo-reactive monoisocyanate is 93%.

The monoisocyanate is characterized by NMR spectroscopy (solvent: CDCl$_3$; internal standard: TMS). The following peaks are obtained: singlets at 1.98 ppm (—CH$_3$ of methacrylate), 2.22 ppm (—CH$_2$ at the aromatic residue), 4.41 ppm (—O—CH$_2$—CH$_2$—O—), 5.61 and 6.15 ppm (olefin protons) and 7.04 and 7.22 ppm (aromatic protons). Comparison with the spectra of bis addition products (no singlet at 2.22 ppm) and mixtures shows that in the reaction of the invention, the 2-hydroxyethyl methacrylate is only added to one isocyanate group, at the sterically uninhibited 4-position.

125.2 parts of a phenoxy resin solution (Rutapox 0723) are added in the absence of moisture to a solution of 95 parts of the photo-reactive monoisocyanate produced in the above described manner, in a mixture of 140 parts gammabutyrolactone, 105 parts N-methylpyrrolidone and 0.01 parts dibutyl tin dilaurate, and caused to react under agitation at a temperature of 50° C. (duration: 12 hours). Then, 8 parts 2-hydroxyethyl methacrylate are added at this temperature. After another 5 hours, 4 parts ethanol are added to the reaction solution. After 24 hours, the resin solution has a viscosity of 330 mPa.s and is ready for use in the preparation of coatings.

EXAMPLE 4

A mixture of 23.6 parts pure 2-hydroxyethyl acrylate and 24.8 parts pure 2-hydroxyethyl methacrylate is slowly added in drops at room temperature, under agitation, and in the absence of moisture to a solution of 66.8 parts pure 2,4-diisocyanatotoluene in 115.3 parts dichloromethane. After a reaction time of 30 hours at room temperature, an isocyanate conversion of 98% is determined by titration.

The resulting solution of the photo-reactive monoisocyanate is combined with a solution of 107 parts Rutapox 0717 in 397 parts gamma-butyrolactone, and with 0.22 parts dibutyl tin dilaurate. After a 25-hour reaction at room temperature, 15 parts ethanol are added to the reaction solution. After another 24 hours, the solution is ready to be used for coatings.

This invention has been described in terms of the specific embodiments set forth in detail, but it should be understood that these are by way of illustration only and that the invention is not necessarily limited thereto. Modifications and variations will be apparent from the disclosure and may be resorted to without departing from the spirit of the invention, as those skilled in the art will readily understand. Accordingly, such variations and modifications of the disclosed embodiments are considered to be within the scope of the invention and the following claims.

What is claimed is:

1. A polyether-based photopolymer which comprises an addition product of an olefin-unsaturated monoisocyanate and a phenoxy resin having at least one hydroxyl group.

2. A photopolymer according to claim 1, wherein the phenoxy resin has a molecular weight of 15,000 to 30,000.

3. A photopolymer according to claim 1, wherein the olefin-unsaturated monoisocyanate is an isocyanate having a methacrylate group.

4. A photopolymer according to claim 3, wherein the isocyanate is isocyanatoethyl methacrylate.

5. A photopolymer according to claim 1, wherein the olefin-unsaturated monoisocyanate is an addition product of 2,4-diisocyanatotoluene and a compound selected from the group consisting of hydroxyethyl acrylate, and hydroxyethyl methacrylate.

6. A process for producing a photopolymer according to claim 1, which comprises reacting an olefin-unsaturated monoisocyanate with a phenoxy resin having at least one hydroxyl group, wherein the monoisocyanate and phenoxy resin are reacted in an organic solvent in the presence of a catalyst, or at an elevated temperature, or in the presence of a catalyst and at an elevated temperature.

7. A process according to claim 6, wherein the catalyst is dibutyl tin dilaurate.

8. A process according to calim 6, wherein the catalyst is 1,4-diazabiocyclo[2,2,2]octane.

9. A UV-hardenable plastic coating for elongated materials, which comprises a photopolymer according to claim 1.

10. A damping substance for surface wave filters, which comprises a photopolymer according to claim 1.

11. A process for producing a plastic-coated elongated material, which comprises coating the elongated material with a photopolymer produced according to claim 1, and hardening the coating with UV radiation.

12. A process for producing a plastic-coated substrate surface which comprises coating the substrate surface with a photopolymer produced according to claim 1, and hardening the coating with UV radiation.

13. A coating according to claim 9 wherein the materials are transmission lines or substrate surfaces.

14. A substance according to claim 10 wherein the filters are television intermediate frequency filters.

15. A process according to claim 11 wherein the material is a transmission line.

16. A UV-hardenable plastic coating for substrate surfaces which comprises a photopolymer according to claim 1.

* * * * *